United States Patent
Sugimoto

(10) Patent No.: US 11,555,835 B2
(45) Date of Patent: Jan. 17, 2023

(54) CURRENT SENSOR

(71) Applicant: Murata Manufacturing Co., Ltd., Nagaokakyo (JP)

(72) Inventor: Takuya Sugimoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/232,369

(22) Filed: Apr. 16, 2021

(65) Prior Publication Data
US 2021/0231711 A1    Jul. 29, 2021

Related U.S. Application Data

(63) Continuation of application No. PCT/JP2019/037573, filed on Sep. 25, 2019.

(30) Foreign Application Priority Data

Nov. 1, 2018 (JP) .............................. JP2018-206476

(51) Int. Cl.
*G01R 19/00* (2006.01)
(52) U.S. Cl.
CPC ..... *G01R 19/0023* (2013.01); *G01R 19/0038* (2013.01)
(58) Field of Classification Search
CPC ............ G01R 19/0023; G01R 19/0038; G01R 15/207
See application file for complete search history.

(56) References Cited

U.S. PATENT DOCUMENTS

2005/0030018 A1* 2/2005 Shibahara .............. G01R 15/20
324/251
2007/0090825 A1* 4/2007 Shoji .................... G01R 15/205
324/117 R (Continued)

FOREIGN PATENT DOCUMENTS

JP       2007-108069 A    4/2007
JP       2010-256316 A    11/2010

(Continued)

OTHER PUBLICATIONS

Official Communication issued in International Patent Application No. PCT/JP2019/037573, dated Nov. 12, 2019.

*Primary Examiner* — Feba Pothen
(74) *Attorney, Agent, or Firm* — Keating & Bennett, LLP

(57) ABSTRACT

A current sensor includes a conductor, and first and second magnetic sensing elements. The first magnetic sensing element is positioned such that the magnetic field component in the second direction of the magnetic field generated by the measurement target current flowing through the first conductor portion is opposite in polarity to the magnetic field component in the second direction of the magnetic field generated by the measurement target current flowing through the third conductor portion. The second magnetic sensing element is positioned such that the magnetic field component in the second direction of the magnetic field generated by the measurement target current flowing through the second conductor portion is opposite in polarity to the magnetic field component in the second direction of the magnetic field generated by the measurement target current flowing through the third conductor portion.

16 Claims, 8 Drawing Sheets

(56) References Cited

U.S. PATENT DOCUMENTS

2007/0096716 A1   5/2007   Shoji
2015/0022196 A1   1/2015   Hebiguchi et al.

FOREIGN PATENT DOCUMENTS

| JP | 2011-013200 A | 1/2011 | |
|----|---------------|--------|---|
| JP | 2014-002070 A | 1/2014 | |
| JP | 2014-002071 A | 1/2014 | |
| JP | 2016-040558 A | 3/2016 | |
| JP | 2018-096795 A | 6/2018 | |
| WO | WO-2016035606 A1 * | 3/2016 | ............. G01R 15/20 |

* cited by examiner

CURRENT SENSOR

CROSS REFERENCE TO RELATED APPLICATIONS

This application claims the benefit of priority to Japanese Patent Application No. 2018-206476 filed on Nov. 1, 2018 and is a Continuation Application of PCT Application No. PCT/JP2019/037573 filed on Sep. 25, 2019. The entire contents of each application are hereby incorporated herein by reference.

BACKGROUND OF THE INVENTION

1. Field of the Invention

The present invention relates to a current sensor.

2. Description of the Related Art

Known current sensors have configurations disclosed in related art documents, such as Japanese Unexamined Patent Application Publication Nos. 2016-40558, 2018-96795, and 2007-108069.

The current sensors described in Japanese Unexamined Patent Application Publication Nos. 2016-40558, 2018-96795, and 2007-108069 include a U-shaped conductor, a first magnetic sensing element and a second magnetic sensing element. The U-shaped conductor includes a first conductor portion and a second conductor portion spaced apart from each other and elongated in parallel with each other, and a third conductor portion joining the first conductor portion and the second conductor portion. The first magnetic sensing element detects a magnetic field generated by a measurement target current flowing through the first conductor portion. The second magnetic sensing element detects a magnetic field generated by the measurement target current flowing through the second conductor portion. The first magnetic sensing element and the second magnetic sensing element each detect a magnetic field component in a first direction of the magnetic field generated by the corresponding measurement target current. In accordance with the output from the first magnetic sensing element and the output from the second magnetic sensing element, the value of a measurement target current flowing through the U-shaped conductor is calculated.

When a magnetic field component in a second direction, which is perpendicular to the first direction, of a magnetic field generated by the measurement target current flowing through the third conductor portion affects the first magnetic sensing element and the second magnetic sensing element, the first magnetic sensing element and the second magnetic sensing element deteriorate in terms of characteristics, such as measurement accuracy, sensitivity, and offset voltage. This consequently degrades the measurement accuracy of the current sensor.

SUMMARY OF THE INVENTION

Preferred embodiments of the present invention provide current sensors that are each capable of accurately measuring the value of a measurement target current by using magnetic sensing elements that are less affected by a magnetic field component in a direction perpendicular or substantially perpendicular to a magnetic field detection direction of the magnetic sensing elements.

A current sensor according to a preferred embodiment of the present invention includes a conductor, and a first magnetic sensing element and a second magnetic sensing element. The first magnetic sensing element and the second magnetic sensing element each detect a magnetic field component in a first direction of a magnetic field generated by a measurement target current flowing through the conductor. The conductor is symmetrical or substantially symmetrical about a symmetry axis extending in a second direction perpendicular or substantially perpendicular to the first direction. The conductor includes a first conductor portion, a second conductor portion, and a third conductor portion. The first conductor portion and the second conductor portion are elongated such that a space between the first conductor portion and the second conductor portion in the first direction increases in the second direction. The third conductor portion joins a forward end portion of the first conductor portion in the second direction and a forward end portion of the second conductor portion in the second direction. The first magnetic sensing element and the second magnetic sensing element are symmetrically or substantially symmetrically positioned about the symmetry axis. The first magnetic sensing element is located at a position at which the magnetic field component in the second direction of the magnetic field generated by the measurement target current flowing through the first conductor portion is opposite in polarity to the magnetic field component in the second direction of the magnetic field generated by the measurement target current flowing through the third conductor portion. The second magnetic sensing element is located at a position at which the magnetic field component in the second direction of the magnetic field generated by the measurement target current flowing through the second conductor portion is opposite in polarity to the magnetic field component in the second direction of the magnetic field generated by the measurement target current flowing through the third conductor portion.

Preferred embodiments of the present invention are each able to accurately measure the value of a measurement target current by using magnetic sensing elements that are less affected by a magnetic field component in a direction perpendicular or substantially perpendicular to a magnetic field detection direction of the magnetic sensing elements.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
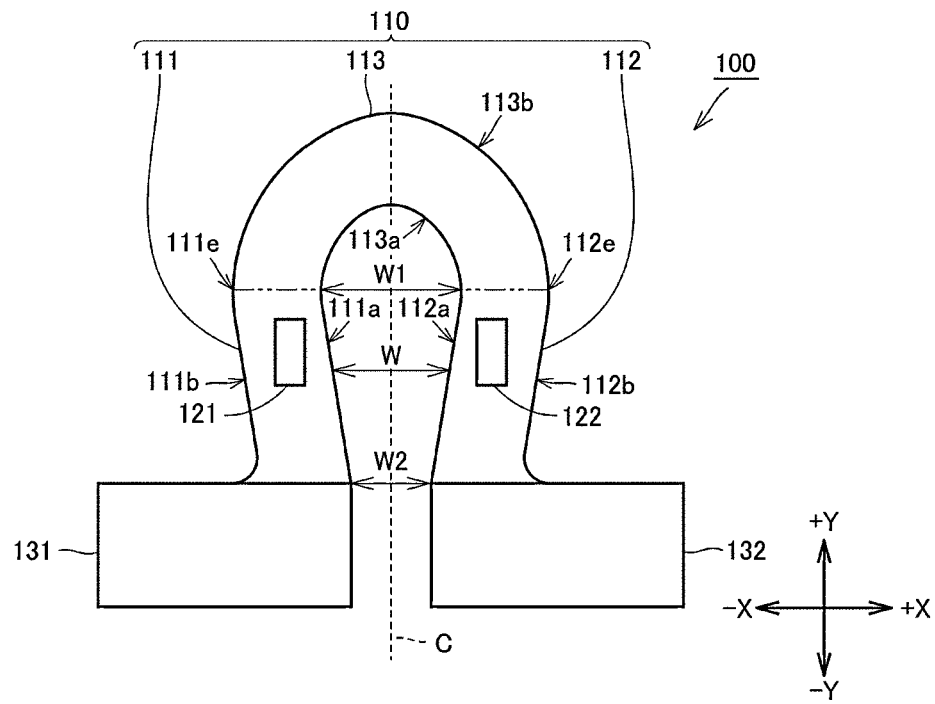
FIG. 1 is a plan view illustrating a structure of a current sensor according to a first preferred embodiment of the present invention.

Hereinafter, current sensors according to preferred embodiments of the present invention will be described with reference to the drawings. In the following descriptions of the preferred embodiments, identical or corresponding portions in the drawings are assigned the same reference characters, and descriptions thereof are not repeated.

First Preferred Embodiment

FIG. 1 is a plan view illustrating a structure of a current sensor according to a first preferred embodiment of the present invention. The X direction is a first direction, and the Y direction is a second direction. The X direction is perpendicular or substantially perpendicular to the Y direction. As illustrated in FIG. 1, a current sensor 100 according to the first preferred embodiment of the present invention includes a conductor 110, and a first magnetic sensing element 121 and a second magnetic sensing element 122.

Figure 2:
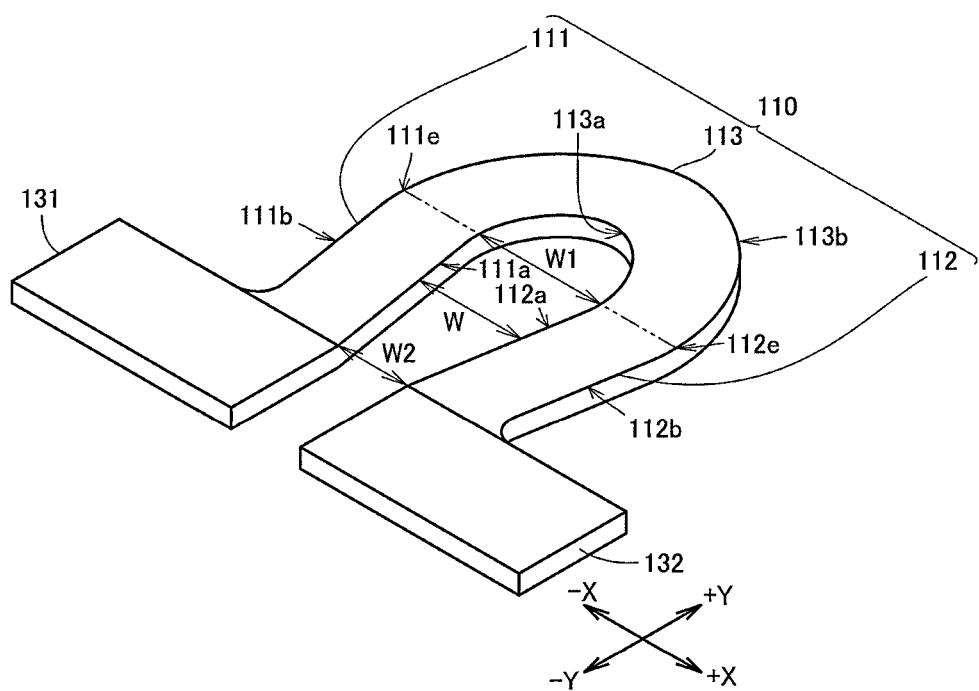
FIG. 2 is a perspective view illustrating the shape of a conductor included in the current sensor according to the first preferred embodiment of the present invention.

FIG. 2 is a perspective view illustrating the shape of the conductor included in the current sensor according to the first preferred embodiment of the present invention. As illustrated in FIGS. 1 and 2, the conductor 110 is symmetrical or substantially symmetrical about a symmetry axis C extending in the Y direction.

The conductor 110 includes a first conductor portion 111, a second conductor portion 112, and a third conductor portion 113. The first conductor portion 111 and the second conductor portion 112 are symmetrically or substantially symmetrically positioned about the symmetry axis C. The first conductor portion 111 and the second conductor portion 112 are elongated such that a space W in the X direction between the first conductor portion 111 and the second conductor portion 112 increases in the Y direction. Specifically, at a forward end portion of the first conductor portion 111 and a forward end portion of the second conductor portion 112 in the Y direction, which are an end portion of the first conductor portion 111 and an end portion of the second conductor portion 112 in the +Y direction, the space W between the first conductor portion 111 and the second conductor portion 112 in the X direction is a widest space W1. At a backward end portion of the first conductor portion 111 and a backward end portion of the second conductor portion 112 in the Y direction, which are an end portion of the first conductor portion 111 and an end portion of the second conductor portion 112 in the −Y direction, the space W is a narrowest space W2.

The backward end portion of the first conductor portion 111 in the Y direction, which is the end portion of the first conductor portion 111 in the −Y direction, is joined to a first connection terminal 131. The first connection terminal 131 is elongated in the X direction. A forward end portion of the first connection terminal 131 in the X direction, which is an end portion of the first connection terminal 131 in the +X direction, is joined to the backward end portion of the first conductor portion 111 in the Y direction.

The backward end portion of the second conductor portion 112 in the Y direction, which is the end portion of the second conductor portion 112 in the −Y direction, is joined to a second connection terminal 132. The second connection terminal 132 is elongated in the X direction. A backward end portion of the second connection terminal 132 in the X direction, which is an end portion of the second connection terminal 132 in the −X direction, is joined to the backward end portion of the second conductor portion 112 in the Y direction. The first connection terminal 131 and the second connection terminal 132 are symmetrically positioned about the symmetry axis C.

The third conductor portion 113 joins the forward end portion of the first conductor portion 111 in the Y direction and the forward end portion of the second conductor portion 112 in the Y direction. Specifically, the third conductor portion 113 joins a forward end portion 111e of the first conductor portion 111 in the Y direction and a forward end portion 112e of the second conductor portion 112 in the Y direction. The third conductor portion 113 is shaped into a half ring, that is, a circular or substantially circular arc in plan view. The third conductor portion 113 is symmetrical or substantially symmetrical about the symmetry axis C.

As described above, the conductor 110 is substantially U-shaped. An inner edge portion of the conductor 110 includes an inner edge portion 111a of the first conductor portion 111, an inner edge portion 113a of the third conductor portion 113, and an inner edge portion 112a of the second conductor portion 112. An outer edge portion of the conductor 110, which is opposite to the inner edge portion of the conductor 110, includes an outer edge portion 111b of the first conductor portion 111, an outer edge portion 113b of the third conductor portion 113, and an outer edge portion 112b of the second conductor portion 112.

In the first preferred embodiment of the present invention, the inner edge portion 111a of the first conductor portion 111 and the inner edge portion 112a of the second conductor portion 112 are both linearly elongated while facing each other about the symmetry axis C. The inner edge portion 111a of the first conductor portion 111 and the inner edge portion 112a of the second conductor portion 112 are not necessarily linearly elongated but may be, for example, curved toward or away from the symmetry axis C.

In the first preferred embodiment of the present invention, the outer edge portion 111b of the first conductor portion 111 and the outer edge portion 112b of the second conductor portion 112 are preferably linearly elongated. At the outer periphery of the conductor 110, the longitudinal direction of the outer edge portion 111b of the first conductor portion 111 preferably crosses the X direction at about 90° or less, for example. At the outer periphery of the conductor 110, the longitudinal direction of the outer edge portion 112b of the second conductor portion 112 preferably crosses the X direction at about 90° or less, for example.

In the first preferred embodiment of the present invention, at the outer periphery of the conductor 110, the longitudinal direction of the outer edge portion 111b of the first conductor portion 111 and the longitudinal direction of the outer edge portion 112b of the second conductor portion 112 both preferably cross the X direction at about 70°, for example. A backward end portion of the outer edge portion 111b of the first conductor portion 111 in the Y direction is curved toward the symmetry axis C. A backward end portion of the outer edge portion 112b of the second conductor portion 112 in the Y direction is curved toward the symmetry axis C.

While in the first preferred embodiment of the present invention, the inner edge portion 113a of the third conductor portion 113 is preferably has a shape of a semi-ellipse, for example, the inner edge portion 113a of the third conductor portion 113 may be shaped into a semicircle, for example.

The conductor 110 is preferably made of copper, for example. The material of the conductor 110 is not limited to this example but may be a metal such as silver or aluminum or an alloy thereof, for example. The conductor 110 may be subjected to surface treatment. For example, the surface of the conductor 110 may be overlaid with at least one plating layer of a metal, such as, for example, nickel, tin, silver, or copper, or an alloy thereof.

The first connection terminal 131 and the second connection terminal 132 are preferably made of a material selected similarly to the conductor 110. The first connection terminal 131 and the second connection terminal 132 may be provided together with the conductor 110.

The first magnetic sensing element 121 and the second magnetic sensing element 122 each detect a magnetic field component in the X direction of a magnetic field generated by a measurement target current flowing through the conductor 110. The first magnetic sensing element 121 and the second magnetic sensing element 122 have odd function input-output characteristics in which a positive value is outputted when a magnetic field component in the +X direction is detected, while a negative value is outputted when a magnetic field component in the −X direction is detected.

Figure 3:
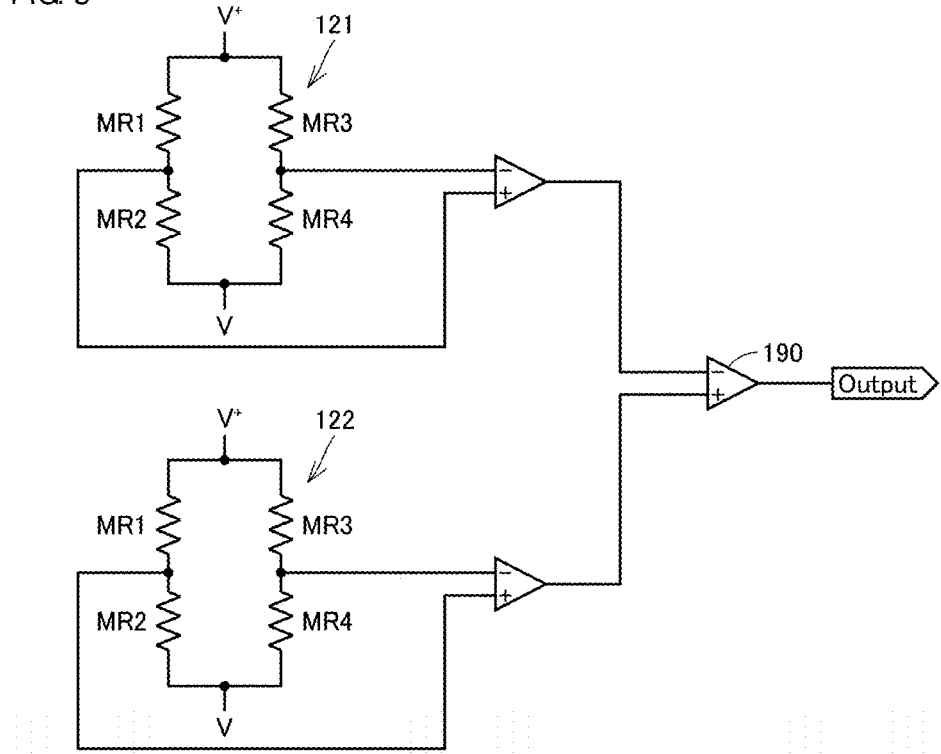
FIG. 3 is a circuit diagram illustrating a circuit configuration of the current sensor according to the first preferred embodiment of the present invention.

FIG. 3 is a circuit diagram illustrating a circuit configuration of the current sensor according to the first preferred embodiment of the present invention. As illustrated in FIG. 3, the first magnetic sensing element 121 and the second magnetic sensing element 122 each preferably include a Wheatstone bridge circuit including four tunnel magneto resistance (TMR) elements, for example. The first magnetic sensing element 121 and the second magnetic sensing element 122 may each include, for example, a bridge circuit composed of magnetoresistance elements such as giant magneto-resistance (GMR) or anisotropic magneto-resistance (AMR) elements instead of TMR devices. Alternatively, the first magnetic sensing element 121 and the second magnetic sensing element 122 may each include a half-bridge circuit composed of two magnetoresistance elements, for example.

As illustrated in FIG. 3, the first magnetic sensing element 121 and the second magnetic sensing element 122 are both coupled to a differential amplifier 190. The differential amplifier 190 computes a value detected by the first magnetic sensing element 121 and a value detected by the second magnetic sensing element 122, and as a result, the value of the measurement target current flowing through the conductor 110 is calculated. The first magnetic sensing element 121 and the second magnetic sensing element 122 may be coupled to, for example, a subtractor, instead of the differential amplifier 190.

Figure 4:
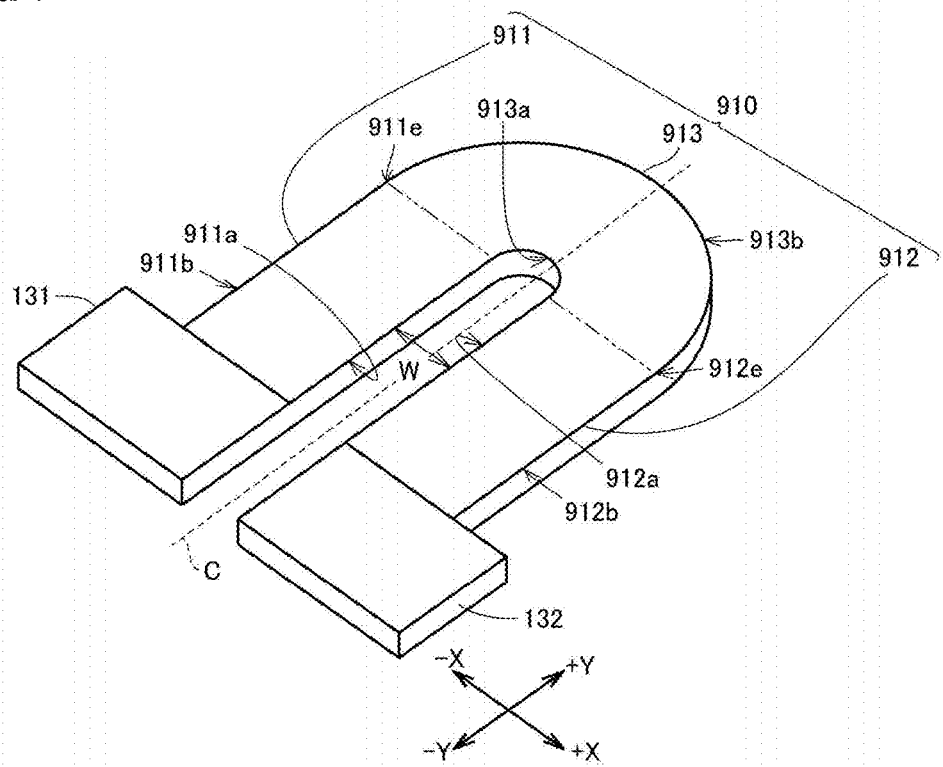
FIG. 4 is a perspective view illustrating the shape of a conductor included in a current sensor according to a comparative example.

Hereinafter, a current sensor according to a comparative example will be described. The current sensor according to the comparative example differs from the current sensor 100 according to the first preferred embodiment of the present invention in the shape of the conductor. FIG. 4 is a perspective view illustrating the shape of the conductor included in the current sensor according to the comparative example.

As illustrated in FIG. 4, a conductor 910 included in the current sensor according to the comparative example is symmetrical or substantially symmetrical about the symmetry axis C extending in the Y direction.

The conductor 910 includes a first conductor portion 911, a second conductor portion 912, and a third conductor portion 913. The first conductor portion 911 and the second conductor portion 912 are symmetrically or substantially symmetrically positioned about the symmetry axis C. The first conductor portion 911 and the second conductor portion 912 are elongated in parallel or substantially in parallel in the Y direction. This means that the space W between the first conductor portion 911 and the second conductor portion 912 in the X direction is constant or substantially constant at any position in the Y direction.

A backward end portion of the first conductor portion 911 in the Y direction is joined to the first connection terminal 131. The first connection terminal 131 is elongated in the X direction. The forward end portion of the first connection terminal 131 in the X direction is joined to the backward end portion of the first conductor portion 911 in the Y direction.

A backward end portion of the second conductor portion 912 in the Y direction is joined to the second connection terminal 132. The second connection terminal 132 is elongated in the X direction. The backward end portion of the second connection terminal 132 in the X direction is joined to the backward end portion of the second conductor portion 912 in the Y direction. The first connection terminal 131 and the second connection terminal 132 are symmetrically positioned about the symmetry axis C.

The third conductor portion 913 joins the forward end portion of the first conductor portion 911 in the Y direction and the forward end portion of the second conductor portion 912 in the Y direction. Specifically, the third conductor portion 913 joins a forward end portion 911e of the first conductor portion 911 in the Y direction and a forward end portion 912e of the second conductor portion 912 in the Y direction. The third conductor portion 913 is shaped into a half ring. The third conductor portion 913 is symmetrical or substantially symmetrical about the symmetry axis C.

As described above, the conductor 910 is U-shaped. An inner edge portion of the conductor 910 includes an inner edge portion 911a of the first conductor portion 911, an inner edge portion 913a of the third conductor portion 913, and an inner edge portion 912a of the second conductor portion 912. An outer edge portion of the conductor 910, which is opposite to the inner edge portion of the conductor 910, includes an outer edge portion 911b of the first conductor portion 911, an outer edge portion 913b of the third conductor portion 913, and an outer edge portion 912b of the second conductor portion 912.

In the comparative example, the inner edge portion 913a of the third conductor portion 913 is shaped into a semicircle. The conductor 910 is made of copper.

The following is descriptions of results of simulation analysis regarding a distribution of a magnetic field generated when a measurement target current flows through the conductor of the current sensor according to the first preferred embodiment of the present invention and a distribution of a magnetic field generated when a measurement target current flows through the conductor of the current sensor according to the comparative example.

The simulation analysis was performed under the conditions described below. In the conductor 110, the length of the first conductor portion 111 in the Y direction and the length of the second conductor portion 112 in the Y direction were both about 1.0 mm; the widest space W1 was about 0.6 mm; the narrowest space W2 was about 0.4 mm; the thickness was about 0.1 mm. In the conductor 910, the length of the first conductor portion 911 in the Y direction and the length of the second conductor portion 912 in the Y direction were both about 1.0 mm; the space W was about 0.4 mm; the thickness was about 0.1 mm. A measurement target current of about 100 A was passed through each of the conductor 110 and the conductor 910. The measurement target current was passed from the first connection terminal 131 through the conductor 110 or the conductor 910 toward the second connection terminal 132.

Figure 5:
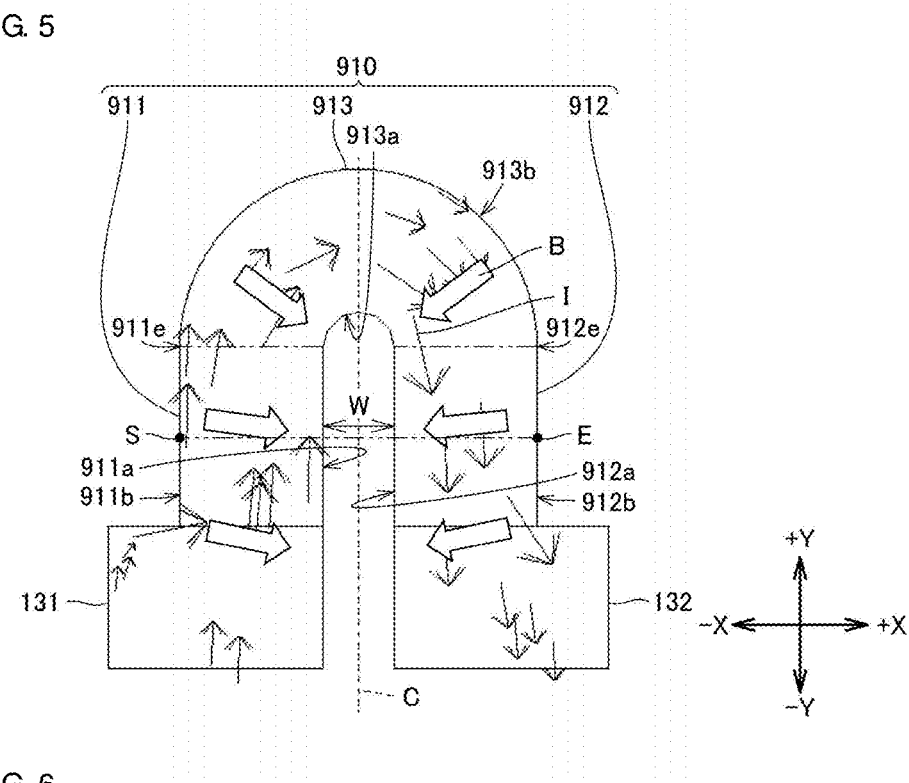
FIG. 5 is a simulation analysis diagram illustrating the direction of a magnetic field generated when a measurement target current flows through the conductor of the current sensor according to the comparative example.

FIG. 5 is a simulation analysis diagram illustrating the direction of a magnetic field generated when the measurement target current flows through the conductor of the current sensor according to the comparative example. In FIG. 5, solid-line arrows I indicate the current density, and solid-white arrows B indicate the direction of the magnetic field. As the current density increases, the size of the solid-line arrow I increases. For the current sensor according to the comparative example, the distribution of the magnetic field of an area from a start point S to an end point E indicated in FIG. 5 was analyzed. Coordinates of the start point S are (−1.0, 0.0, 0.2), and coordinates of the end point E are (1.0, 0.0, 0.2).

The magnetic field generated by a measurement target current is oriented perpendicularly or substantially perpendicularly to the direction in which the measurement target current flows. Thus, as illustrated in FIG. 5, at the backward end portion of the first conductor portion 911 in the Y direction, a magnetic field including a magnetic field component in the +X direction and a magnetic field component in the −Y direction was generated perpendicularly or substantially perpendicularly to the direction in which measurement target current was flowing from the first connection terminal 131 into the first conductor portion 911.

At a middle portion of the first conductor portion 911 in the Y direction, a magnetic field including a magnetic field component in the +X direction and a magnetic field component in the −Y direction was generated perpendicularly or substantially perpendicularly to the direction in which the measurement target current was flowing through the first conductor portion 911.

At the forward end portion of the first conductor portion 911 in the Y direction, a magnetic field including a magnetic field component in the +X direction and a magnetic field component in the −Y direction was generated perpendicularly or substantially perpendicularly to the direction in which the measurement target current was flowing into the third conductor portion 913 close to the forward end portion of the first conductor portion 911.

As described above, the magnetic field generated around the first conductor portion 911 includes a magnetic field component in the −Y direction at any position.

As illustrated in FIG. 5, at the backward end portion of the second conductor portion 912 in the Y direction, a magnetic field including a magnetic field component in the −X direction and a magnetic field component in the −Y direction was generated perpendicularly or substantially perpendicularly to the direction in which the measurement target current was flowing out from the second conductor portion 912 toward the second connection terminal 132.

At a middle portion of the second conductor portion 912 in the Y direction, a magnetic field including a magnetic field component in the −X direction and a magnetic field component in the −Y direction was generated perpendicularly or substantially perpendicularly to the direction in which the measurement target current was flowing through the second conductor portion 912.

At the forward end portion of the second conductor portion 912 in the Y direction, a magnetic field including a magnetic field component in the −X direction and a magnetic field component in the −Y direction was generated perpendicularly or substantially perpendicularly to the direction in which the measurement target current was flowing into the third conductor portion 913 close to the forward end portion of the second conductor portion 912.

As described above, the magnetic field generated around the second conductor portion 912 includes a magnetic field component in the −Y direction at any position.

Figure 6:
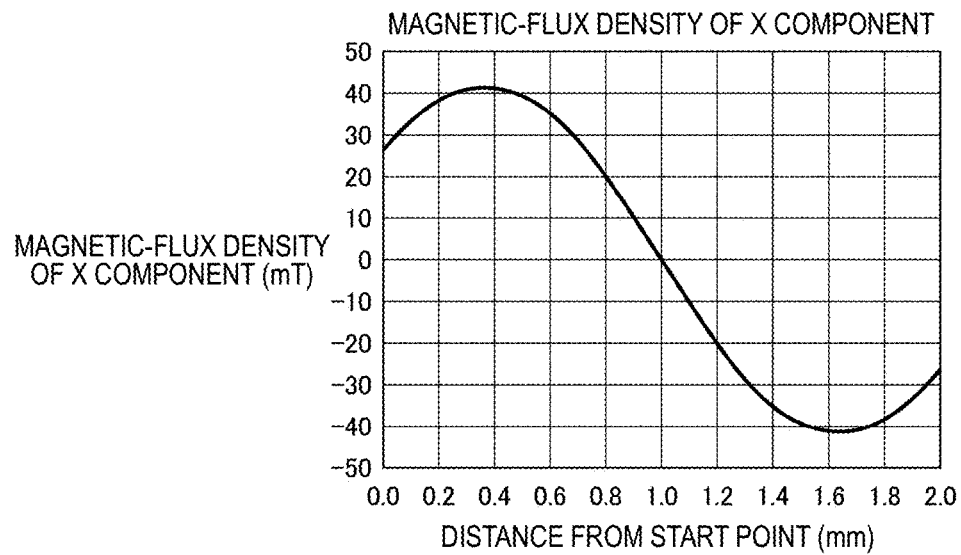
FIG. 6 is a graph representing the distribution of magnetic-flux density of components in the X direction of the magnetic field of the area from a start point S to an end point E indicated in FIG. 5.
Figure 7:
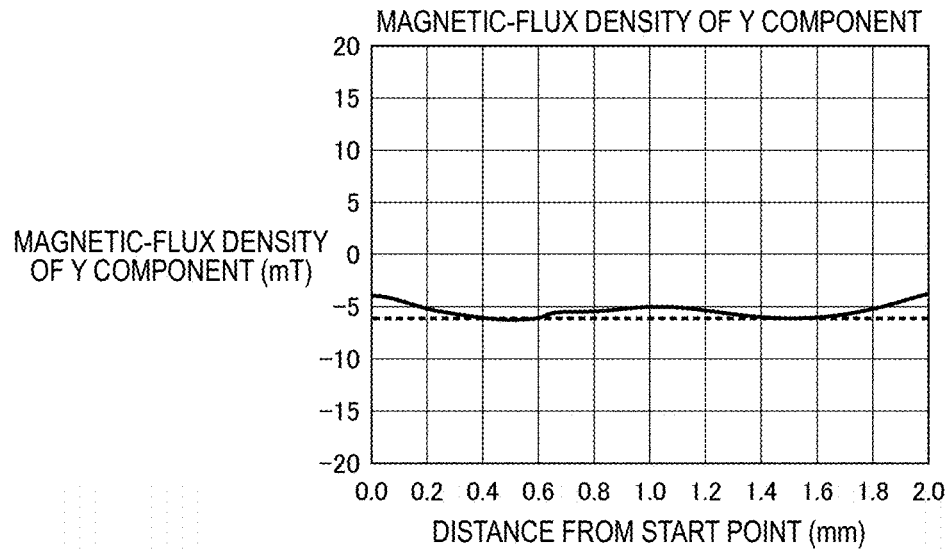
FIG. 7 is a graph representing the distribution of magnetic-flux density of components in the Y direction of the magnetic field of the area from a start point S to an end point E indicated in FIG. 5.

FIG. 6 is a graph representing the distribution of magnetic-flux density of the components in the X direction of the magnetic field of the area from the start point S to the end point E indicated in FIG. 5. FIG. 7 is a graph representing the distribution of magnetic-flux density of the components in the Y direction of the magnetic field of the area from the start point S to the end point E indicated in FIG. 5. In FIGS. 6 and 7, the vertical axis indicates the magnetic-flux density (mT) and the horizontal axis indicates the distance from the start point (mm).

Because the direction in which the measurement target current flows through the first conductor portion 911 is opposite to the direction in which the measurement target current flows through the second conductor portion 912, the magnetic field component in the X direction of the magnetic field generated around the first conductor portion 911 is opposite in polarity to the magnetic field component in the X direction of the magnetic field generated around the second conductor portion 912, as illustrated in FIG. 6.

As described above, the magnetic field generated around the first conductor portion 911 and the magnetic field generated around the second conductor portion 912 both include the magnetic field component in the −Y direction at any position. The magnetic field component in the −Y direction remained at almost the same level in the area from the start point S to the end point E as illustrated in FIG. 7. In FIG. 7, a dotted line indicates the lowest level of the magnetic field component in the Y direction of the magnetic field generated around the first conductor portion 911 and the magnetic field generated around the second conductor portion 912.

When the magnetic field component in the Y direction affects the first magnetic sensing element 121 and the second magnetic sensing element 122, the first magnetic sensing element 121 and the second magnetic sensing element 122 deteriorate in terms of characteristics, such as measurement accuracy, sensitivity, and offset voltage, for example.

Figure 8:
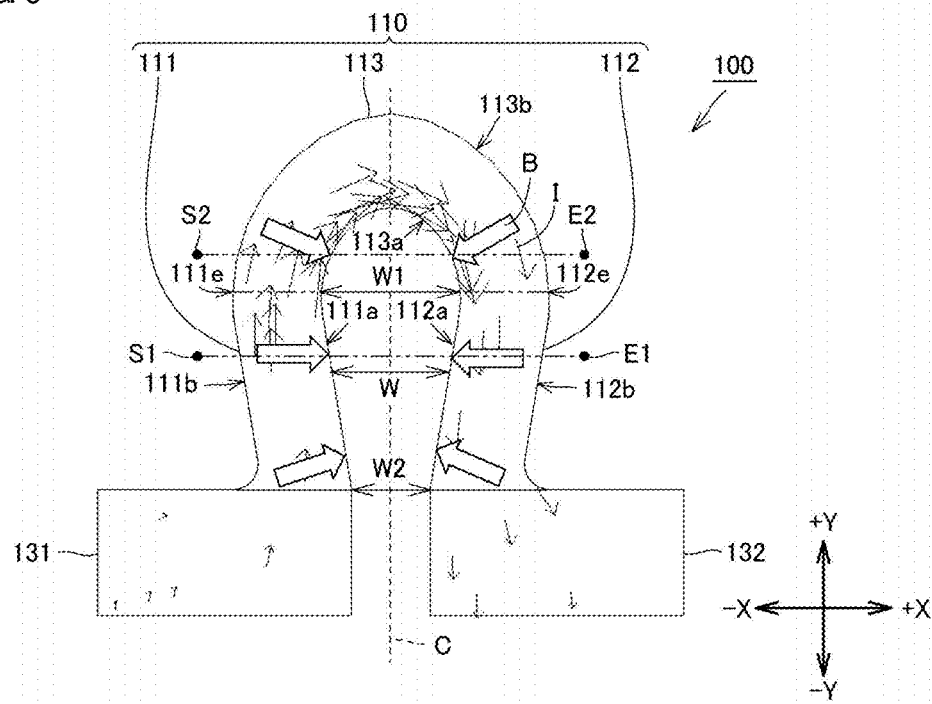
FIG. 8 is a simulation analysis diagram illustrating the direction of a magnetic field generated when the measurement target current flows through the conductor of the current sensor according to the first preferred embodiment of the present invention.

FIG. 8 is a simulation analysis diagram illustrating the direction of a magnetic field generated when the measurement target current flows through the conductor of the current sensor according to the first preferred embodiment of the present invention. In FIG. 8, solid-line arrows I indicate the current density, and solid-white arrows B indicate the direction of the magnetic field. For the current sensor according to the first preferred embodiment of the present invention, the distribution of the magnetic field of an area from the start point S1 to the end point E1 and an area from the start point S2 to the end point E2 indicated in FIG. 8 was analyzed. Coordinates of the start point S1 are (−1.5, −0.5, 0.2), and coordinates of the end point E1 are (1.5, −0.5, 0.2). Coordinates of the start point S2 are (−1.5, 0.3, 0.2), and coordinates of the end point E2 are (1.5, 0.3, 0.2).

As illustrated in FIG. 8, at the backward end portion of the first conductor portion 111 in the Y direction, a magnetic field including a magnetic field component in the +X direction and a magnetic field component in the +Y direction was generated perpendicularly or substantially perpendicularly to the direction in which the measurement target current was flowing from the first connection terminal 131 into the first conductor portion 111.

At a middle portion of the first conductor portion 111 in the Y direction, a magnetic field mainly including a magnetic field component in the +X direction and including almost no magnetic field component in the Y direction was generated perpendicularly or substantially perpendicularly to the direction in which the measurement target current was flowing through the first conductor portion 111.

At the forward end portion of the first conductor portion 111 in the Y direction, a magnetic field including a magnetic field component in the +X direction and a magnetic field component in the −Y direction was generated perpendicularly or substantially perpendicularly to the direction in which the measurement target current was flowing into the third conductor portion 113 close to the forward end portion of the first conductor portion 111.

As such, the forward end portion of the first conductor portion 111 in the Y direction is opposite in polarity to the backward end portion of the first conductor portion 111 in the Y direction with respect to the magnetic field component in the Y direction of the magnetic field generated around the first conductor portion 111.

As illustrated in FIG. 8, at the backward end portion of the second conductor portion 112 in the Y direction, a magnetic field including a magnetic field component in the −X direction and a magnetic field component in the +Y direction was generated perpendicularly or substantially perpendicularly to the direction in which the measurement target current was flowing out from the second conductor portion 112 toward the second connection terminal 132.

At a middle portion of the second conductor portion 112 in the Y direction, a magnetic field mainly including a magnetic field component in the −X direction and including almost no magnetic field component in the Y direction was generated perpendicularly or substantially perpendicularly to the direction in which the measurement target current was flowing through the second conductor portion 112.

At the forward end portion of the second conductor portion 112 in the Y direction, a magnetic field including a magnetic field component in the −X direction and a magnetic field component in the −Y direction was generated perpendicularly or substantially perpendicularly to the direction in which the measurement target current was flowing into the third conductor portion 113 close to the forward end portion of the second conductor portion 112.

As such, the forward end portion of the second conductor portion 112 in the Y direction is opposite in polarity to the backward end portion of the second conductor portion 112 in the Y direction with respect to the magnetic field component in the Y direction of the magnetic field generated around the second conductor portion 112.

Figure 9:
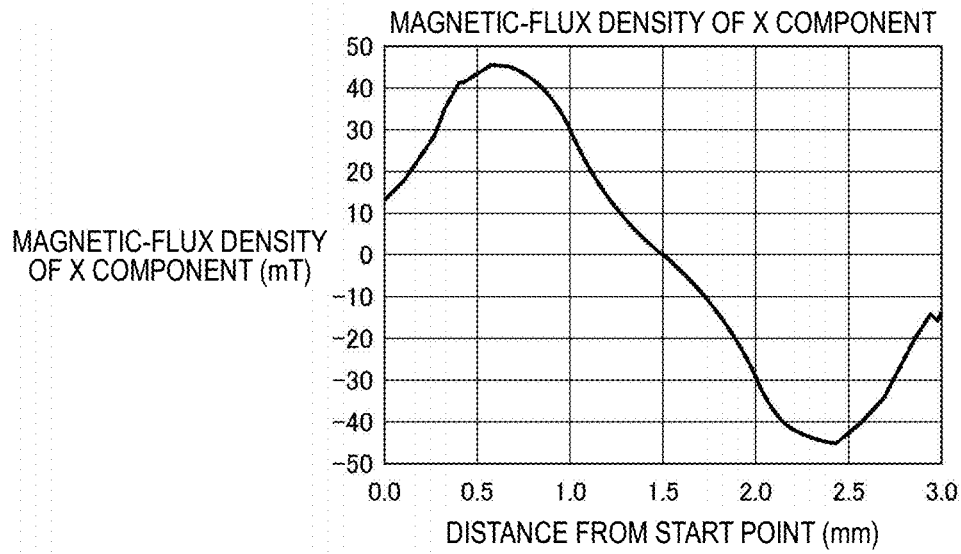
FIG. 9 is a graph representing the distribution of magnetic-flux density of the components in the X direction of the magnetic field of the area from a start point S1 to an end point E1 indicated in FIG. 8.
Figure 10:
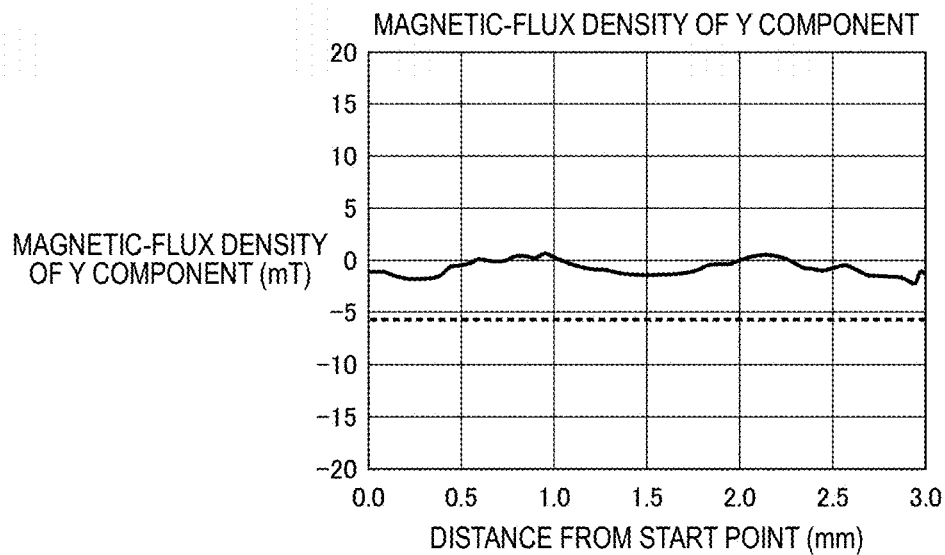
FIG. 10 is a graph representing the distribution of magnetic-flux density of the components in the Y direction of the magnetic field of the area from the start point S1 to the end point E1 indicated in FIG. 8.
Figure 11:
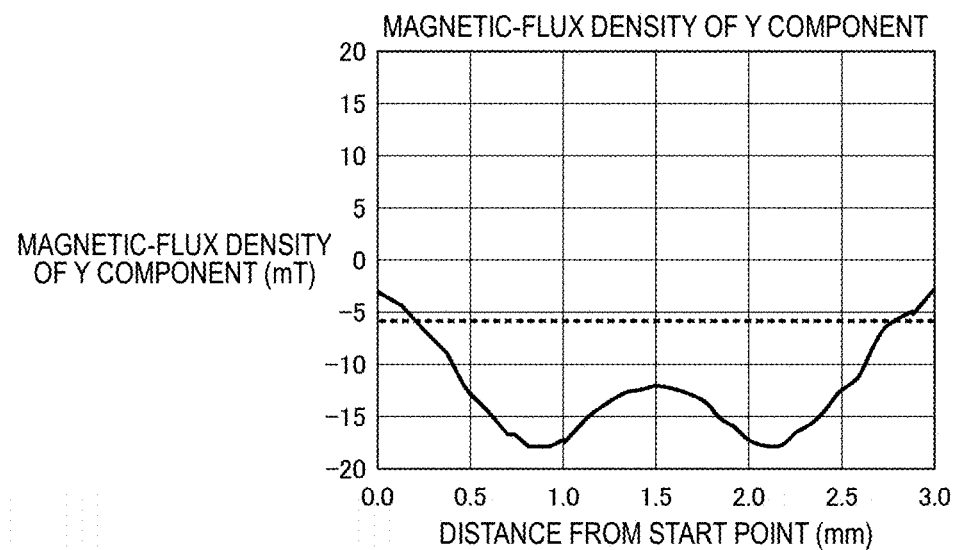
FIG. 11 is a graph representing the distribution of magnetic-flux density of the components in the Y direction of the magnetic field of the area from a start point S2 to an end point E2 indicated in FIG. 8.

FIG. 9 is a graph representing the distribution of magnetic-flux density of the components in the X direction of the magnetic field of the area from the start point S1 to the end point E1 indicated in FIG. 8. FIG. 10 is a graph representing the distribution of magnetic-flux density of the components in the Y direction of the magnetic field of the area from the start point S1 to the end point E1 indicated in FIG. 8. FIG. 11 is a graph representing the distribution of magnetic-flux density of the components in the Y direction of the magnetic field of the area from the start point S2 to the end point E2 indicated in FIG. 8. In FIGS. 9 to 11, the vertical axis indicates the magnetic-flux density (mT) and the horizontal axis indicates the distance from the start point (mm).

Because the direction in which the measurement target current flows through the first conductor portion 111 is opposite to the direction in which the measurement target current flows through the second conductor portion 112, the magnetic field component in the X direction of the magnetic field generated around the first conductor portion 111 is opposite in polarity to the magnetic field component in the X direction of the magnetic field generated around the second conductor portion 112, as illustrated in FIG. 9.

As described above, because the forward end portion in the Y direction is opposite in polarity to the backward end portion in the Y direction with respect to both the magnetic field generated around the first conductor portion 111 and the magnetic field generated around the second conductor portion 112, the magnetic field component in the Y direction remained at almost zero in the area from the start point S1 to the end point E1 as illustrated in FIG. 10. In FIG. 10, a dotted line indicates the lowest level of the magnetic field component in the Y direction of the comparative example.

The analysis described above proved that the current sensor 100 according to the first preferred embodiment of the present invention can provide an area almost without the magnetic field component in the Y direction.

As illustrated in FIG. 11, the magnetic field component in the Y direction of the area from the start point S2 to the end point E2 is greater in the current sensor 100 according to the first preferred embodiment than in the current sensor according to the comparative example, because the effect of the magnetic field generated around the third conductor portion 113 is relatively large. In FIG. 11, a dotted line indicates the lowest level of the magnetic field component in the Y direction of the comparative example.

In the current sensor 100 according to the first preferred embodiment of the present invention, the first magnetic sensing element 121 and the second magnetic sensing element 122 are symmetrically or substantially symmetrically positioned about the symmetry axis C as illustrated in FIG. 1. The first magnetic sensing element 121 and the second magnetic sensing element 122 are mounted at a substrate, which is not illustrated in the drawings.

The first magnetic sensing element 121 is located at a position at which the magnetic field component in the Y direction of the magnetic field generated by the measurement target current flowing through the first conductor portion 111 is opposite in polarity to the magnetic field component in the Y direction of the magnetic field generated by the measurement target current flowing through the third conductor portion 113.

The second magnetic sensing element 122 is located at a position at which the magnetic field component in the Y direction of the magnetic field generated by the measurement target current flowing through the second conductor portion 112 is opposite in polarity to the magnetic field component in the Y direction of the magnetic field generated by the measurement target current flowing through the third conductor portion 113.

As a result, the current sensor 100 according to the first preferred embodiment of the present invention can reduce the magnetic field component in the Y direction, which affects both the first magnetic sensing element 121 and the second magnetic sensing element 122, and as a result, it is possible to reduce or prevent degradation of characteristics of the first magnetic sensing element 121 and the second magnetic sensing element 122, such as, for example, measurement accuracy, sensitivity, and offset voltage.

In the current sensor 100 according to the first preferred embodiment of the present invention, the first magnetic sensing element 121 is positioned within the area occupied by the first conductor portion 111 in the Y direction. The second magnetic sensing element 122 is positioned within in the area occupied by the second conductor portion 112 in the Y direction.

Thus, the first magnetic sensing element 121 and the second magnetic sensing element 122 are positioned in areas almost without the magnetic field component in the Y direction. Thus, the current sensor 100 according to the first preferred embodiment of the present invention can accurately measure the value of the measurement target current while reducing or preventing the effect of the magnetic field component in the Y direction on the first magnetic sensing element 121 and the second magnetic sensing element 122.

In the first preferred embodiment of the present invention, the inner edge portion 111a of the first conductor portion 111 and the inner edge portion 112a of the second conductor portion 112 are linearly elongated, and consequently, relatively large areas in the Y direction can be used almost without the magnetic field component in the Y direction, which ensures the robustness of measurement accuracy of the current sensor 100 with respect to the position of the first magnetic sensing element 121 in the Y direction and the position of the second magnetic sensing element 122 in the Y direction.

In the first preferred embodiment of the present invention, the outer edge portion 111b of the first conductor portion 111 and the outer edge portion 112b of the second conductor portion 112 are linearly elongated, and at the outer periphery of the conductor 110, the longitudinal direction of the outer edge portion 111b of the first conductor portion 111 preferably crosses the X direction at about 90° or less. This facilitates the generation of a magnetic field including the magnetic field component in the +Y direction at the backward end portion of the first conductor portion 111 in the Y direction and the backward end portion of the second conductor portion 112 in the Y direction.

Second Preferred Embodiment

Hereinafter, a current sensor according to a second preferred embodiment of the present invention will be described with reference to the drawings. The current sensor according to the second preferred embodiment of the present invention differs from the current sensor 100 according to the first preferred embodiment of the present invention only in the shape of the outer edge portion of the first conductor portion and the shape of the outer edge portion of the second conductor portion. Descriptions of configurations identical or substantially identical to the configurations of the current sensor 100 according to the first preferred embodiment of the present invention will not be repeated.

Figure 12:
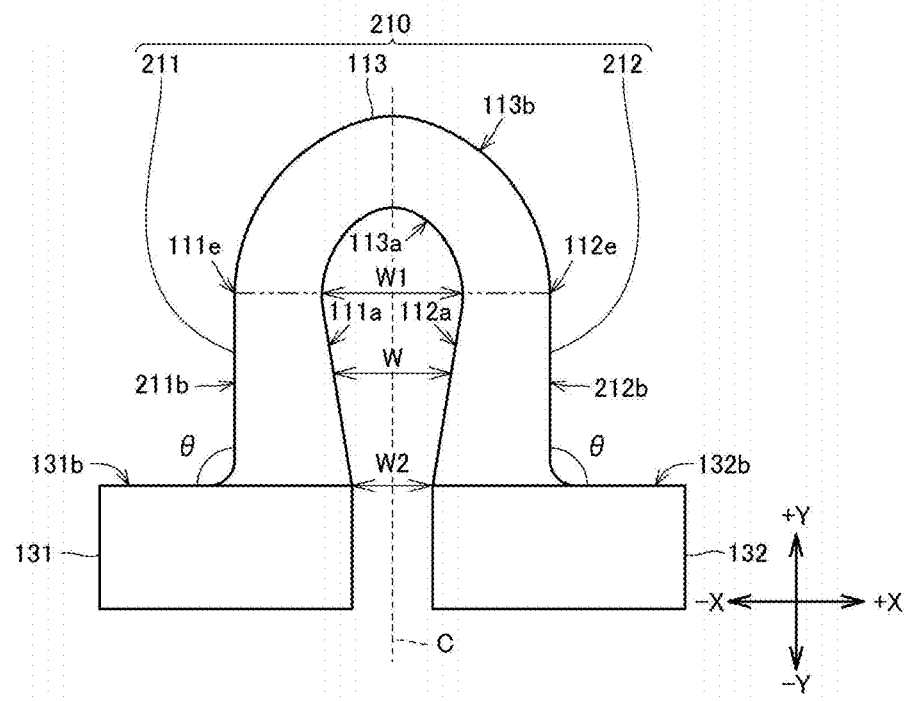
FIG. 12 is a plan view illustrating the shape of a conductor included in a current sensor according to a second preferred embodiment of the present invention.

FIG. 12 is a plan view illustrating the shape of a conductor included in the current sensor according to the second preferred embodiment of the present invention. As illustrated in FIG. 12, a conductor 210 included in the current sensor according to the second preferred embodiment of the present invention includes a first conductor portion 211, a second conductor portion 212, and the third conductor portion 113.

In the second preferred embodiment of the present invention, an outer edge portion 211b of the first conductor portion 211 and an outer edge portion 212b of the second conductor portion 212 are linearly elongated. At the outer periphery of the conductor 210, the longitudinal direction of the outer edge portion 211b of the first conductor portion 211 preferably crosses the X direction at an angle θ of about 90°, for example. At the outer periphery of the conductor 210, the longitudinal direction of the outer edge portion 212b of the second conductor portion 212 preferably crosses the X direction at an angle θ of about 90°, for example.

This means that the longitudinal direction of a conductor-side end portion 131b of the first connection terminal 131 and the longitudinal direction of the outer edge portion 211b of the first conductor portion 211 cross each other at an angle θ of about 90°, for example. The longitudinal direction of a conductor-side end portion 132b of the second connection terminal 132 and the longitudinal direction of the outer edge portion 212b of the second conductor portion 212 cross each other at an angle θ of about 90°, for example.

The following is a description about simulation results of how the conductor is heated, with comparison between the current sensor 100 according to the first preferred embodiment of the present invention and the current sensor according to the second preferred embodiment of the present invention. The simulation was performed under the conditions identical or substantially identical to the conditions described in the first preferred embodiment.

Figure 13:
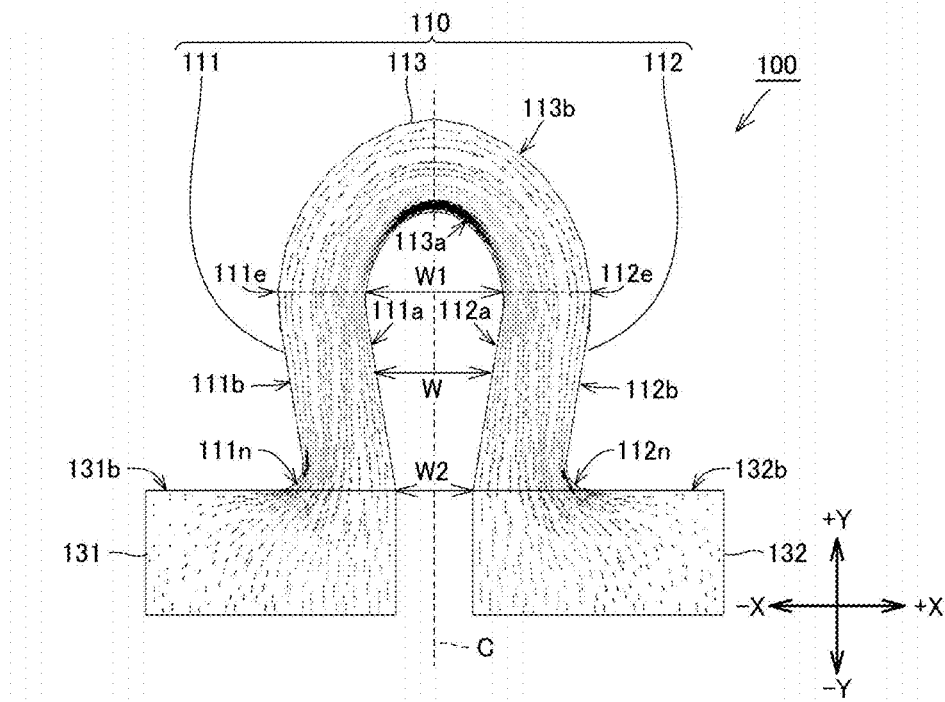
FIG. 13 is a simulation analysis diagram illustrating how the conductor is heated when the measurement target current flows through the conductor of the current sensor according to the first preferred embodiment of the present invention.
Figure 14:
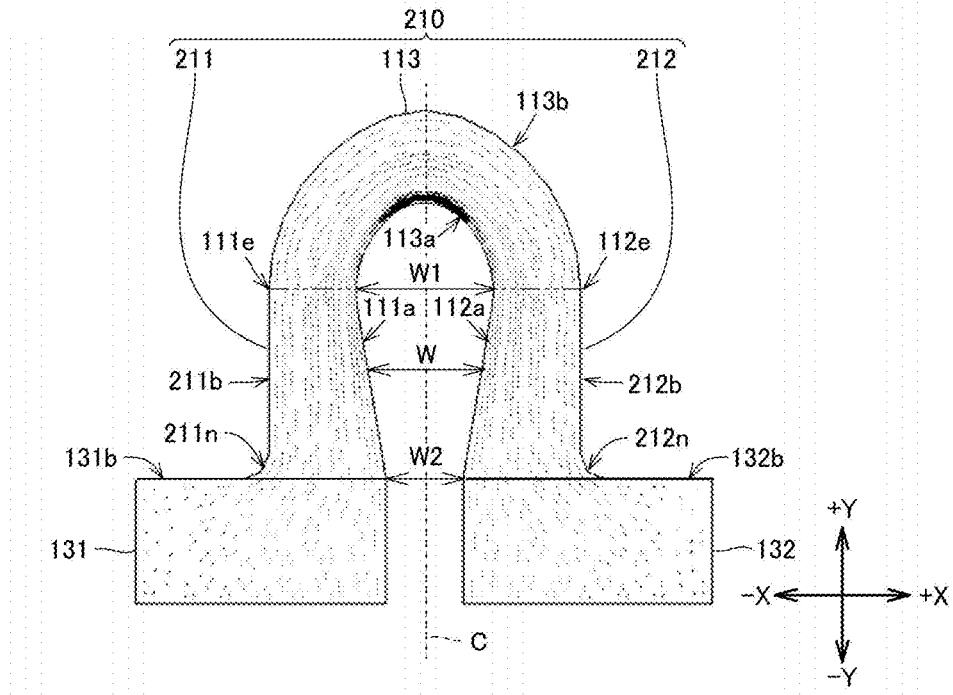
FIG. 14 is a simulation analysis diagram illustrating how the conductor is heated when the measurement target current flows through the conductor of the current sensor according to the second preferred embodiment of the present invention.

FIG. 13 is a simulation analysis diagram illustrating how the conductor is heated when the measurement target current flows through the conductor of the current sensor according to the first preferred embodiment of the present invention. FIG. 14 is a simulation analysis diagram illustrating how the conductor is heated when the measurement target current flows through the conductor of the current sensor according to the second preferred embodiment of the present invention. In FIGS. 13 and 14, heating temperature increases as color darkens.

As illustrated in FIG. 13, in the current sensor 100 according to the first preferred embodiment of the present invention, the temperature of a curved portion 111n, which joins the outer edge portion 111b of the first conductor portion 111 and the conductor-side end portion 131b of the first connection terminal 131, was relatively high. The temperature of a curved portion 112n, which joins the outer edge portion 112b of the second conductor portion 112 and the conductor-side end portion 132b of the second connection terminal 132, was relatively high.

As illustrated in FIG. 14, in the current sensor according to the second preferred embodiment of the present invention, the temperature of a curved portion 211n, which joins the outer edge portion 211b of the first conductor portion 211 and the conductor-side end portion 131b of the first connection terminal 131, was lower than the temperature of the curved portion 111n of the current sensor 100 according to the first preferred embodiment of the present invention. Similarly, in the current sensor according to the second preferred embodiment of the present invention, the temperature of a curved portion 212n, which joins the outer edge portion 212b of the second conductor portion 212 and the conductor-side end portion 132b of the second connection terminal 132, was lower than the temperature of the curved portion 112n of the current sensor 100 according to the first preferred embodiment of the present invention.

Current tends to flow in curved portions. Thus, in comparison to the current sensor 100 according to the first preferred embodiment of the present invention, the curved portions 211n and 212n of the current sensor according to the second preferred embodiment of the present invention are more gentle so that heat is reduced, which results in more reliable performance of the current sensor.

Third Preferred Embodiment

Hereinafter, a current sensor according to a third preferred embodiment of the present invention will be described with reference to the drawings. The current sensor according to the third preferred embodiment of the present invention differs from the current sensor according to the second preferred embodiment of the present invention only in further including a fourth conductor portion. Descriptions of configurations identical or substantially identical to the configurations of the current sensor according to the second preferred embodiment of the present invention will not be repeated.

Figure 15:
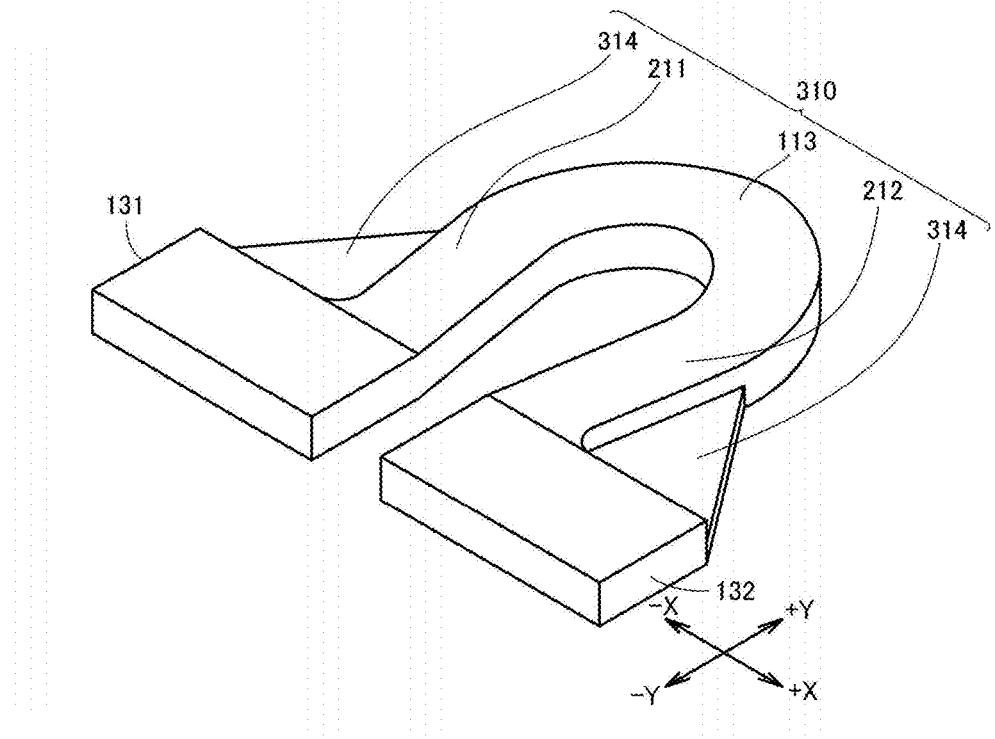
FIG. 15 is a perspective view illustrating the shape of a conductor included in a current sensor according to a third preferred embodiment of the present invention.

FIG. 15 is a perspective view illustrating the shape of the conductor included in the current sensor according to the third preferred embodiment of the present invention. As illustrated in FIG. 15, a conductor 310 included in the current sensor according to the third preferred embodiment of the present invention further includes fourth conductor portions 314. The fourth conductor portion 314 is thinner than all of the first conductor portion 211, the second conductor portion 212, and the third conductor portion 113. The fourth conductor portion 314 extends from an edge portion of at least one of the first conductor portion 211, the second conductor portion 212 and the third conductor portion 113.

In the current sensor according to the third preferred embodiment of the present invention, the fourth conductor portions 314 extend from the outer edge portion of the first conductor portion 211 and the outer edge portion of the second conductor portion 212. The fourth conductor portion 314 extending from the outer edge portion of the first conductor portion 211 is joined to the first connection terminal 131. The fourth conductor portion 314 extending from the outer edge portion of the second conductor portion 212 is joined to the second connection terminal 132.

The fourth conductor portion 314 is preferably, for example, about half or less as thick as the first conductor portion 211, the second conductor portion 212, and the third conductor portion 113.

Because the current sensor according to the third preferred embodiment of the present invention includes the fourth conductor portion 314, the conductor 310 can discharge more heat so that heat of the conductor 310 is reduced, which results in more reliable performance of the current sensor.

Furthermore, the thickness of the fourth conductor portion 314 is preferably, for example, about half or less of the thickness of the first conductor portion 211, the thickness of the second conductor portion 212, and the thickness of the third conductor portion 113. This reduces or prevents degradation of measurement accuracy of the current sensor due to the measurement element target current flowing through the fourth conductor portion 314.

Figure 16:
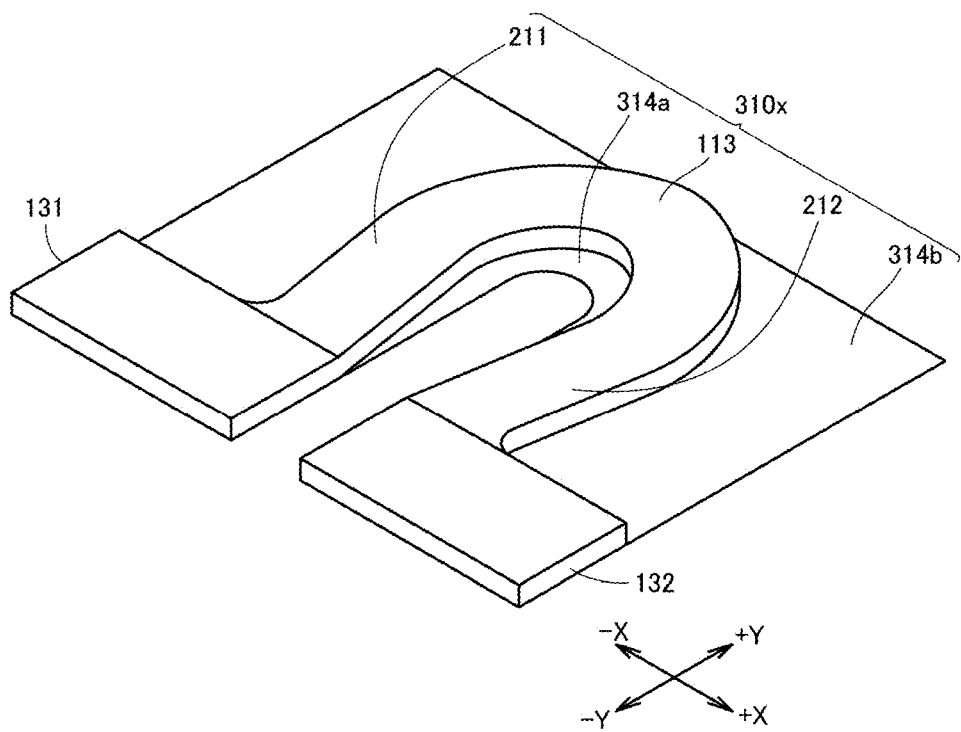
FIG. 16 is a perspective view illustrating the shape of a conductor included in a current sensor according to a modification to the third preferred embodiment of the present invention.

FIG. 16 is a perspective view illustrating the shape of a conductor included in a current sensor according to a modification to the third preferred embodiment of the present invention. As illustrated in FIG. 16, a conductor 310x included in the current sensor according to a modification to the third preferred embodiment of the present invention further includes fourth conductor portions 314a and 314b. The fourth conductor portions 314a and 314b are thinner than all of the first conductor portion 211, the second conductor portion 212, and the third conductor portion 113. The fourth conductor portions 314a and 314b each extend from an edge portion of at least one of the first conductor portion 211, the second conductor portion 212 and the third conductor portion 113.

The fourth conductor portion 314a extends from the inner edge portion of the first conductor portion 211, the inner edge portion of the second conductor portion 212, and the inner edge portion of the third conductor portion 113. The fourth conductor portion 314b extends from the outer edge portion of the first conductor portion 211, the outer edge portion of the second conductor portion 212, and the outer edge portion of the third conductor portion 113.

Also in the current sensor according to the modification to the third preferred embodiment of the present invention, the conductor 310x can discharge more heat so that heat of the conductor 310x is reduced, which results in more reliable performance of the current sensor.

The configurations described above in the preferred embodiments may be combined together.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A current sensor comprising:
a conductor; and
a first magnetic sensing element and a second magnetic sensing element to detect a magnetic field component in a first direction of a magnetic field generated by a measurement target current flowing through the conductor; wherein the conductor is symmetrical or substantially symmetrical about a symmetry axis extending in a second direction perpendicular or substantially perpendicular to the first direction;

the conductor includes:
- a first conductor portion and a second conductor portion elongated such that a space between the first conductor portion and the second conductor portion in the first direction increases in the second direction; and
- a third conductor portion joining a forward end portion of the first conductor portion in the second direction and a forward end portion of the second conductor portion in the second direction;

the third conductor portion has a half ring shape;

the first magnetic sensing element and the second magnetic sensing element are symmetrical or substantially symmetrical about the symmetry axis;

the first magnetic sensing element is located at a position at which a magnetic field component in the second direction of a magnetic field generated by the measurement target current flowing through the first conductor portion is opposite in polarity to a magnetic field component in the second direction of a magnetic field generated by the measurement target current flowing through the third conductor portion; and the second magnetic sensing element is located at a position at which a magnetic field component in the second direction of a magnetic field generated by the measurement target current flowing through the second conductor portion is opposite in polarity to the magnetic field component in the second direction of the magnetic field generated by the measurement target current flowing through the third conductor portion.

2. The current sensor according to claim 1, wherein
the first magnetic sensing element is positioned within an area occupied by the first conductor portion in the second direction; and
the second magnetic sensing element is positioned within an area occupied by the second conductor portion in the second direction.

3. The current sensor according to claim 1, wherein an inner edge portion of the first conductor portion and an inner edge portion of the second conductor portion facing each other about the symmetry axis are linearly elongated.

4. The current sensor according to claim 3, wherein
an outer edge portion of the first conductor portion and an outer edge portion of the second conductor portion are linearly elongated, the outer edge portion of the first conductor portion being opposite to the inner edge portion of the first conductor portion, the outer edge portion of the second conductor portion being opposite to the inner edge portion of the second conductor portion; and
at an outer periphery of the conductor, a longitudinal direction of the outer edge portion of the first conductor portion and a longitudinal direction of the outer edge portion of the second conductor portion both cross the first direction at about 90° or less.

5. The current sensor according to claim 1, wherein the conductor further includes a fourth conductor portion that is thinner than each of the first conductor portion, the second conductor portion, and the third conductor portion, and extends from an edge portion of at least one of the first conductor portion, the second conductor portion, and the third conductor portion.

6. The current sensor according to claim 5, wherein the fourth conductor portion is about half or less as thick as each of the first conductor portion, the second conductor portion, and the third conductor portion.

7. The current sensor according to claim 4, wherein at the outer periphery of the conductor, the longitudinal direction of the outer edge portion of the first conductor portion and the longitudinal direction of the outer edge portion of the second conductor portion both cross the first direction at about 70°.

8. The current sensor according to claim 1, wherein the half ring shape is a semi-ellipse shape.

9. The current sensor according to claim 1, wherein each of the first, second, and third conductor portions is made of copper.

10. The current sensor according to claim 1, further comprising:
- a first connection terminal extending in the first direction and connected to the first conductor portion at a backward end portion in the second direction; and
- a second connection terminal extending in the first direction and connected to the second conductor portion at a backward end portion in the second direction.

11. The current sensor according to claim 10, wherein the first and second connection terminals are made of copper.

12. The current sensor according to claim 1, wherein the first and second magnetic sensing elements each include a Wheatstone bridge circuit including four tunnel magneto resistance elements.

13. The current sensor according to claim 1, further comprising a differential amplifier coupled to both of the first and second magnetic sensing elements.

14. The current sensor according to claim 5, wherein the fourth conductor portion extends from an outer edge portion of the first conductor portion and an outer edge portion of the second conductor portion.

15. The current sensor according to claim 5, wherein the fourth conductor portion extends from an inner edge portion of the first conductor portion, an inner edge portion of the second conductor portion, and an inner edge portion of the third conductor portion.

16. The current sensor according to claim 15, wherein the fourth conductor portion extends from an outer edge portion of the first conductor portion, an outer edge portion of the second conductor portion, and an outer edge portion of the third conductor portion.

* * * * *